United States Patent [19]

Mizutani

[11] Patent Number: 5,796,114
[45] Date of Patent: Aug. 18, 1998

[54] EXPOSURE APPARATUS AND METHOD FOR POSITIONING WITH A HIGH ACCURACY

[75] Inventor: Hideo Mizutani, Yokohama, Japan

[73] Assignee: Nikon Corporation, Tokyo, Japan

[21] Appl. No.: 576,999

[22] Filed: Dec. 26, 1995

[30] Foreign Application Priority Data

Dec. 28, 1994 [JP] Japan ............... 6-327919

[51] Int. Cl.$^6$ ............... G01N 21/86
[52] U.S. Cl. ............... 250/548; 356/400
[58] Field of Search ............... 250/548; 356/400, 356/401, 399

[56] References Cited

U.S. PATENT DOCUMENTS

| | | | |
|---|---|---|---|
| 4,984,890 | 1/1991 | Tojo et al. | 356/356 |
| 5,204,535 | 4/1993 | Mizutani. | |
| 5,214,489 | 5/1993 | Mizutani et al. | 356/363 |
| 5,488,230 | 1/1996 | Mizutani et al. | 250/548 |

FOREIGN PATENT DOCUMENTS 6-310404  11/1994  Japan.

*Primary Examiner*—Edward P. Westin
*Assistant Examiner*—Kevin Pyo
*Attorney, Agent, or Firm*—Pennie & Edmonds LLP

[57] ABSTRACT

In this exposure apparatus, a grating-like reticle mark formed on the lower surface of a reticle is irradiated with illumination light components $RB_1$ and $RB_2$ with an intersecting angle $2\theta$ from two directions, respectively, such that diffracted light components are emitted in directions which divide the intersecting angle $2\theta$ into three pieces. Interference light formed by a +2-order diffracted light component $RB_1^{+2}$ of the illumination light component $RB_1$ and a −1-order diffracted light component $RB_2^{-1}$ of the illumination light component $RB_2$ or interference light formed by a +1-order diffracted light component $RB_1^{+1}$ of the illumination light component $RB_1$ and a −2-order diffracted light component $RB_2^{-2}$ of the illumination light component $RB_2$ is detected.

11 Claims, 10 Drawing Sheets

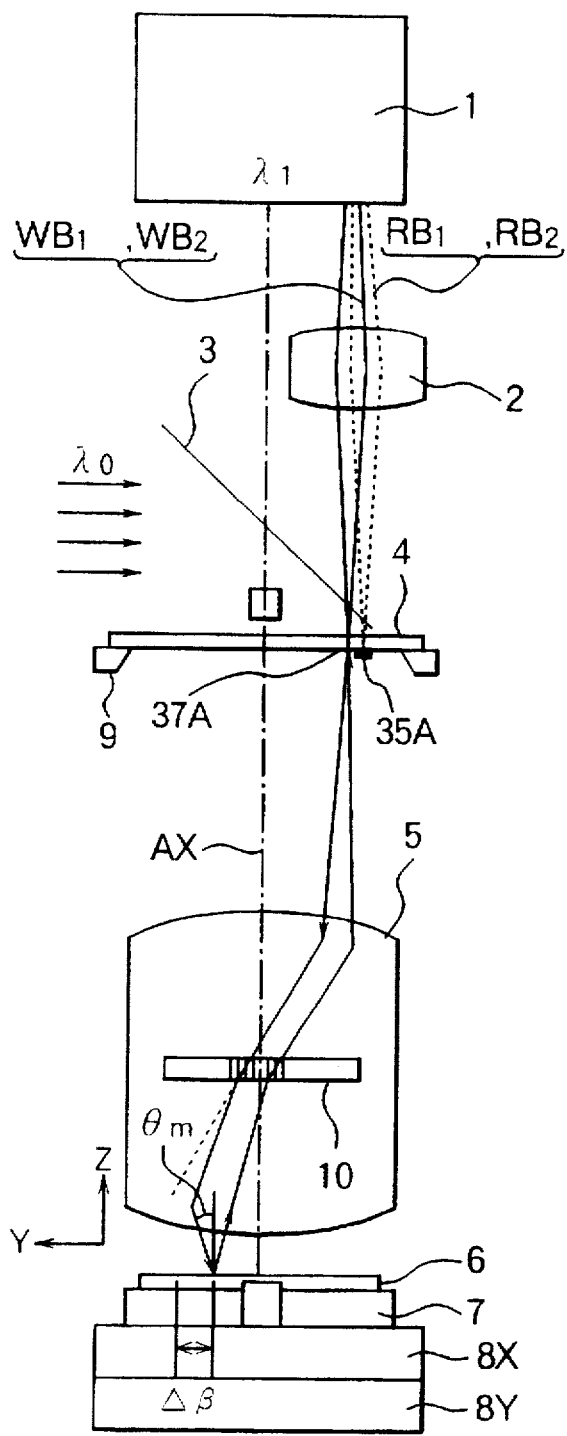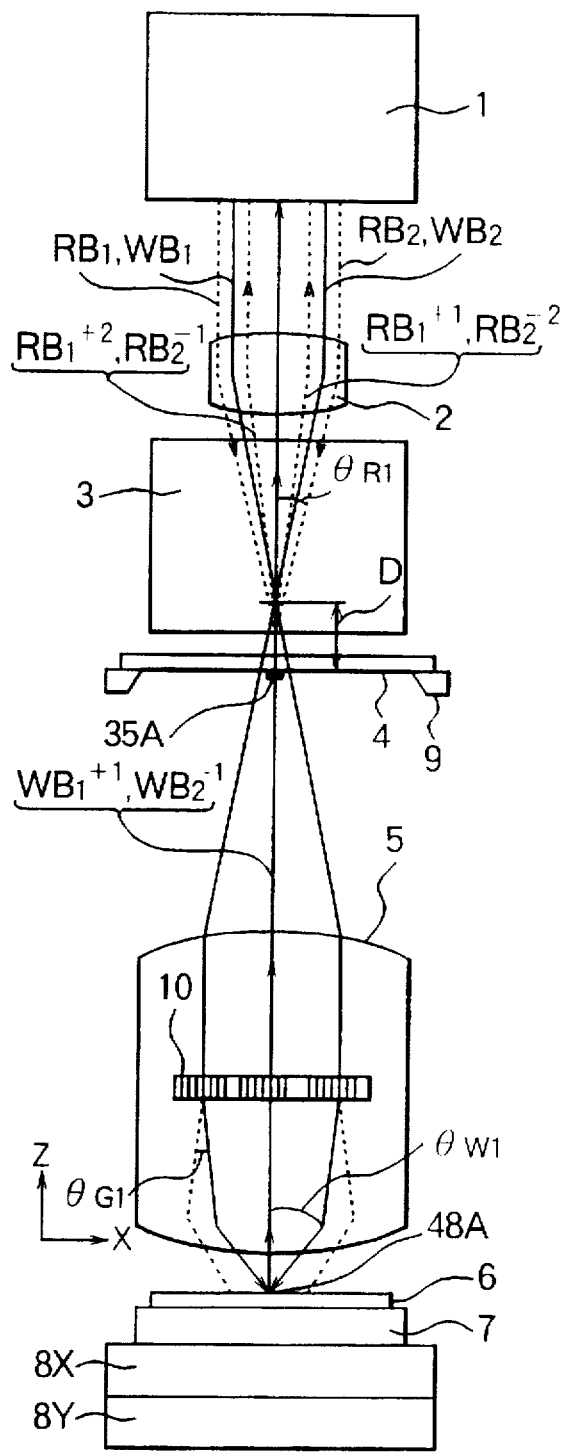

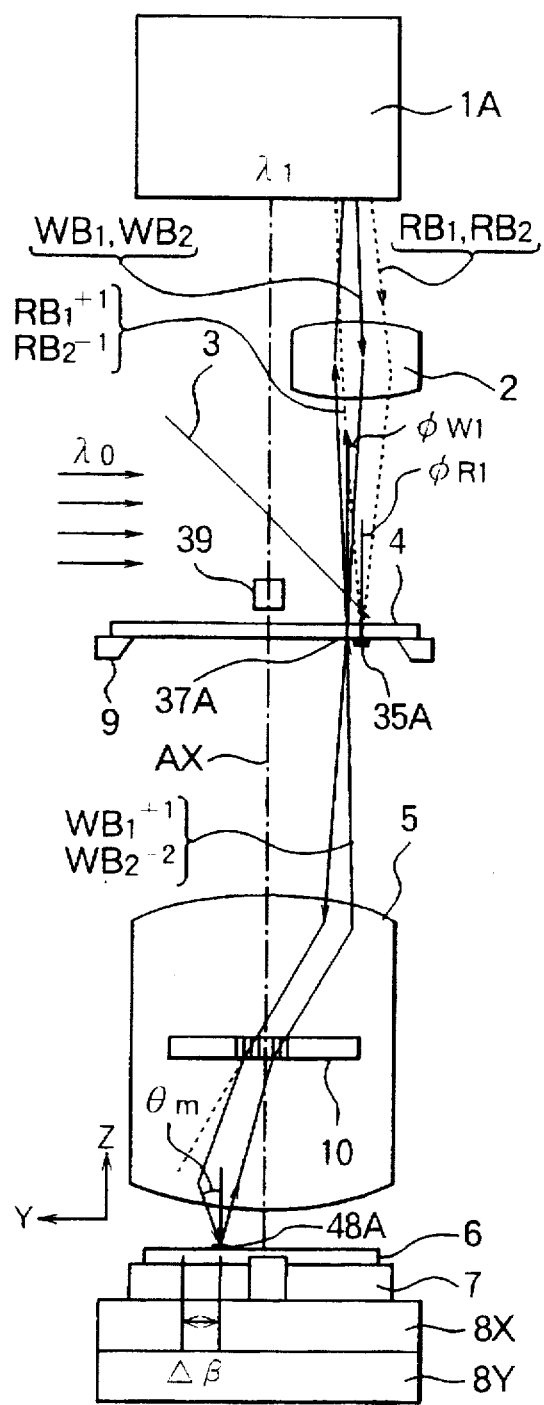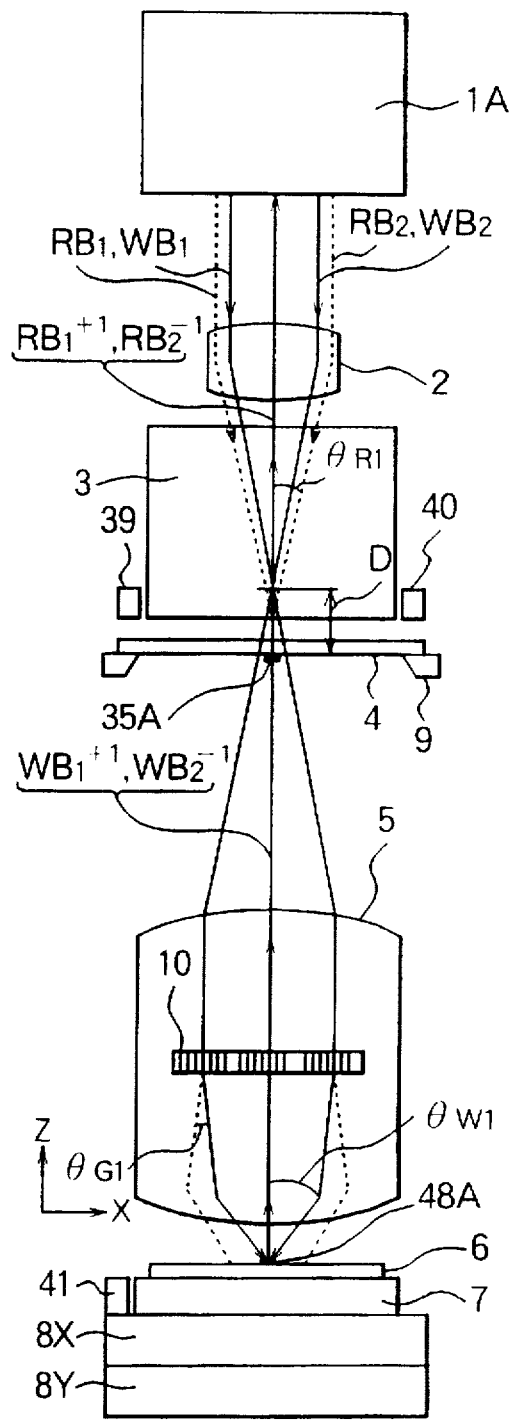

EXPOSURE APPARATUS AND METHOD FOR POSITIONING WITH A HIGH ACCURACY

BACKGROUND OF THE INVENTION

1. Field of the Invention

The present invention relates to an exposure apparatus having an apparatus for positioning a mask and a photosensitive substrate with respect to each other (i.e., alignment apparatus) and, in particular, to such an apparatus which is suitably used in cases where relative positions of the mask and the photosensitive substrate with respect to each other are detected by a two-luminous-flux interference technique.

2. Related Background Art

In projection exposure apparatuses which are used for manufacturing semiconductor devices, liquid crystal display devices, or the like, since a high accuracy should be maintained in mutual registration of circuit patterns in numerous layers formed on a wafer (or glass plate or the like), it is desired, when a pattern of a reticle, as a mask, is projected upon the second or later layer on the wafer, that the reticle and the wafer be positioned (i.e., aligned) with respect to each other with a high accuracy. For this purpose, the projection exposure apparatuses have an alignment apparatus for detecting the positional relationship between the reticle and the wafer with a high accuracy and positioning them with respect to each other.

As a highly accurate alignment sensor for this purpose, there has been known a so-called two-luminous-flux interference type alignment sensor which irradiates a grating-like alignment mark (i.e., reticle mark) on a wafer with a pair of laser beams, which are coherent with each other, and then detects, on the basis of the phase of the interference light comprising a pair of diffracted light components parallelly emitted from the wafer mark (i.e., interference light comprising ±1-order diffracted light components or interference light comprising a zero-order light component and a second-order diffracted light component), the amount of positional deviation of the wafer mark with respect to a predetermined reference position. Such a two-luminous-flux interference type alignment sensor is also known as LIA (Laser Interferometric Alignment) system. The LIA system includes homodyne interference type in which a pair of the illuminating laser beams have the same frequency and heterodyne interference type in which a pair of the illuminating laser beams have frequencies different from each other.

Also, the LIA system can be applied to any of TTR (Through The Reticle) type in which the positional relationship between the reticle and the wafer is detected by way of a projection optical system, TTL (Through The Lens) type in which the position of the wafer is detected by way of the projection optical system, and off-axis type. In particular, when a heterodyne interference type LIA system is applied to a TTR type alignment apparatus, the positional relationship between the reticle and wafer can be maintained under a predetermined condition by a servo system even during exposure, thereby attaining a very high accuracy in positioning. Accordingly, in the following, explanations will be provided mainly for an LIA system which is of both TTR and heterodyne interference types.

In the first place, in the TTR type, the optical system can be simplified when the reticle and the wafer are made conjugate with each other with respect to the alignment light as well. However, since the wavelength of the alignment light differs from that of the exposure light and, accordingly, there remains a chromatic aberration in the projection optical system with respect to the alignment light, U.S. Pat. No. 5,204,535 (referred to as "first prior art" in the following), for example, discloses an LIA system in which a chromatic aberration controlling means such as a phase grating is disposed near the pupil surface (i.e., Fourier transform surface) of the projection optical system so as to correct the chromatic aberration of the projection optical system. In this case, the axial chromatic aberration, in particular, is corrected such that the reticle and the wafer become conjugate with each other with respect to the alignment light.

However, when the reticle and the wafer are made conjugate with each other with respect to the alignment light in the TTR type, a laser beam which has passed through a grating-like alignment mark (i.e., reticle mark) may be directed toward the wafer by way of the projection optical system and then reflected by the wafer to pass through an area near the reticle mark by way of the projection optical system again. In this case, when the intensity of the light reflected by the wafer is strong, a laser beam from the wafer may mingle with the original interference light from the reticle mark so as to decrease the S/N ratio of the photoelectrically converted signal (i.e., beat signal) of the interference light from the reticle mark, thereby deteriorating the accuracy in positional detection of the reticle mark. In order to avoid this problem, Japanese Unexamined Patent Publication Hei No. 6-310404 (referred to as "second prior art" in the following) discloses an LIA system in which the position of the surface conjugate with the wafer with respect to the alignment light is slightly shifted from the reticle by a chromatic aberration controlling means.

SUMMARY OF THE INVENTION

The object of the present invention is to provide an exposure apparatus in which, when the position of a grating-like alignment mark (i.e., reticle or wafer mark) is detected by the two-luminous-flux interference technique, influence of the light reflected by surfaces of phase objects such as of a glass substrate covering the alignment mark or influence of the light reflected by peripheries of the alignment mark is reduced so as to effect positioning with a high accuracy.

A first exposure apparatus in accordance with the present invention comprises an illumination optical system for illuminating, in order to project a pattern formed on a mask upon a photosensitive substrate, the mask with exposure light and an alignment system for detecting the position of a positioning grating mark formed on one of the mask and the photosensitive substrate and, based on the position of the grating mark detected by the alignment system, positions the mask and the photosensitive substrate with respect to each other so as to project the pattern of the mask upon the photosensitive substrate.

The alignment system in this exposure apparatus has an irradiation optical system for irradiating the grating mark with a pair of light beams $RB_1$ and $RB_2$, which are coherent with each other, from predetermined two respective directions, and a detection optical system for photoelectrically converting, among a plurality of diffracted light components, other than zero-order light component, generated by the grating mark upon irradiation with one of the pair of the light beams $RB_1$ and among a plurality of diffracted light components, other than zero-order light component, generated by the grating mark upon irradiation with the other of the pair of the light beams $RB_2$, at least one of two sets of interference light components respectively comprising two pairs of diffracted light components $RB_1^{+2}$, $RB_2^{-1}$; $RB_1^{+1}$, $RB_2^{-2}$, which have absolute values of diffraction orders different from each other and are emitted in the respective same directions, into a signal and, based on the photoelectrically converted signal output from this detection optical system, detects the position of the grating mark.

Preferably, in this case, a second alignment system is provided for detecting the position of a second positioning grating mark which is formed in the mask or the photosensitive substrate so as to correspond to the above-mentioned (first) grating mark. This second alignment system has a second irradiation optical system for irradiating the second grating mark with a pair of light beams $WB_1$ and $WB_2$, which are coherent with each other, from two respective directions and a second detection optical system for converting an interference light component comprising a pair of diffracted light components $WB_1^{+1}$, and $WB_2^{-1}$, which have the same absolute value of diffraction orders and are generated, in a substantially perpendicular direction, by the second grating mark upon irradiation with a light beam from the second irradiation optical system, into a signal so as to detect, based on the photoelectrically converted signal from the second detection optical system, the amount of relative positional deviation of the first grating mark and the second grating mark from each other.

A second exposure apparatus in accordance with the present invention has an illumination optical system for illuminating a mask having a transfer pattern with exposure light; a first irradiation optical system for irradiating a first grating mark, which is formed on the mask with a predetermined pitch in a predetermined measurement direction, with a first pair of light beams $RB_1$, and $RB_2$, which are coherent with each other, from two respective directions; a second irradiation optical system for irradiating a second grating mark, which is formed on the photosensitive substrate with a predetermined pitch in a predetermined measurement direction, with a second pair of light beams $WB_1$ and $WB_2$, which are coherent with each other, from two respective directions; a first detection optical system for photoelectrically converting an interference light component comprising ±1-order diffracted light components generated by the first grating mark into a signal; and a second detection optical system for photoelectrically converting an interference light component comprising ±1-order diffracted light components generated by the second grating mark into a signal and, based on a phase difference between the photoelectrically converted signals output from the first and second detection optical systems, positions the mask and the photoelectric substrate with respect to each other and then projects the pattern of the mask upon the photoelectric substrate. In a non-measurement direction orthogonal to the measurement direction, incident angle $\Phi_{RI}$ of the first pair of light beams with respect to the first grating mark is different from incident angle $\Phi_{WI}$ of the second pair of light beams with respect to the second grating mark.

A third exposure apparatus in accordance with the present invention, though substantially the same as the first exposure apparatus, uses a two-dimensional grating mark which is formed with predetermined pitches respectively in a positional measurement direction and a predetermined non-measurement direction intersecting with the measurement direction. Its alignment system has an irradiation optical system for irradiating the two-dimensional grating mark with a pair of light beams $RB_1$ and $RB_2$, which are coherent with each other, from predetermined two respective directions and a detection optical system for photoelectrically converting, among diffracted light components generated by the two-dimensional grating mark, an interference light component comprising a plurality of diffracted light components $RB_1$ (+1,+1) and $RB_2$ (−1,+1), which individually have a diffraction order other than zero-order with respect to the measurement direction and are generated in the same direction, into a signal. Based on the photoelectrically converted signal output from the detection optical system, the position of the two-dimensional grating mark in the measurement direction is detected.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 2 is a front view mainly showing the stage system and alignment optical system in the projection exposure apparatus used in the above-mentioned embodiment;

FIG. 3 is a side view of FIG. 2;

FIG. 19 is a configurational view showing a projection exposure apparatus in accordance with another embodiment of the present invention in a manner corresponding to FIG. 2;

FIG. 20 is a side view of FIG. 19;

DETAILED DESCRIPTION OF THE PREFERRED EMBODIMENTS

In the above-mentioned second prior art, the alignment light component passing through the reticle is favorably prevented from mingling with the original interference light. Accordingly, unlike the first prior art, the accuracy in detection does not deteriorate due to such mingling. However, even in the second prior art, light reflected by the reticle surface may mingle into a reticle detection optical system in the LIA system, thereby deteriorating the accuracy in the positional detection of the reticle. Namely, since the pattern-forming surface (where a reticle mark is formed as well) is formed on the rear side facing the projection optical system and the laser beam impinging on the reticle mark passes through the glass substrate of the reticle, which is a phase object, the light reflected by the surface of the glass substrate may mingle into the reticle detection optical system.

In particular, since the reticle surface usually has no anti-reflection coating, the light reflected thereon tends to be influential.

On the other hand, in the LIA system, there has been proposed a system in which a laser beam having a plurality of wavelengths is used. When a plurality of wavelengths are used, the influence of the light reflected by the reticle surface becomes relatively low. However, when the alignment light is a monochromatic laser beam, in particular, the fluctuation in intensity of the beat signal may become greater due to interference of the light reflected by the reticle surface with the original diffracted light to be detected, thereby decreasing the accuracy in positional detection to a level outside of a tolerance.

Further, since a photoresist, which is a phase object, is coated on the wafer, the light reflected by the photoresist surface may deteriorate the accuracy in detection of the wafer mark position.

Also, though less influential than the light reflected on the surface, the light reflected by the periphery of the reticle mark on the rear surface of the reticle and the light reflected by the periphery of the wafer mark on the rear surface of the photoresist on the wafer may cause the accuracy in detection to deteriorate.

Figure 13:
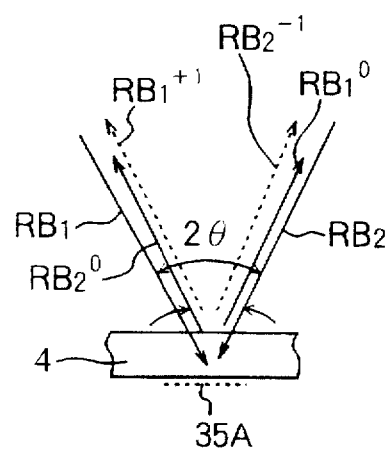
FIG. 13 is an explanatory view showing a case where interference light formed by a zero-order light component and a first-order light component is detected.
Figure 14:
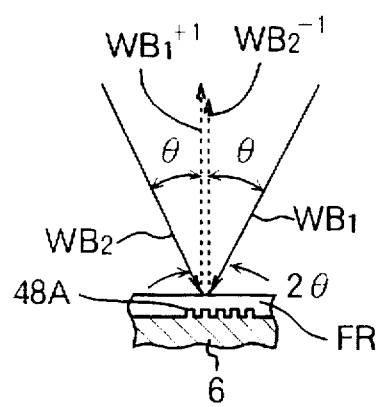
FIG. 14 is an enlarged view showing the periphery of the reticle mark 48A shown in FIG. 2.

For example, it is assumed that, as shown in FIGS. 13 and 14, an amount of positional deviation of a grating mark 35A on a mask 4 and a grating mark 48A on a photosensitive substrate 6 from each other is detected in a two-luminous-flux interference type TTR system. Also, it is assumed that, as shown in FIG. 14, interference light composed of ±1-order diffraction light components $WB_1^{+1}$ and $WB_2^{-1}$ which are emitted in directions substantially perpendicular to the grating mark 48A of the photosensitive substrate 6 is to be detected.

In this case, when it is assumed that ±1-order diffraction light components which are emitted in directions substantially perpendicular to the grating mark 35A on the mask side are also to be detected, the ±1-order diffraction light components from the grating mark 48A on the wafer side may unfavorably mingle therewith. For example, as shown in FIG. 13, assuming that the angle of the two luminous fluxes $RB_1$ and $RB_2$ incident on the grating mark 35A on the mask side with each other is 2θ, their wavelengths is λ, and the pitch of the grating mark 35A in a measurement direction is P; a zero-order light component $RB_1^0$ or $RB_2^0$ in one luminous flux and a ±1-order light component $RB_2^{-1}$ or $RB_1^{+1}$ in the other luminous flux are emitted in the same direction when the pitch P satisfies the following condition:

$$P=\lambda/(2 \sin \theta) \qquad (1)$$

Figure 15:
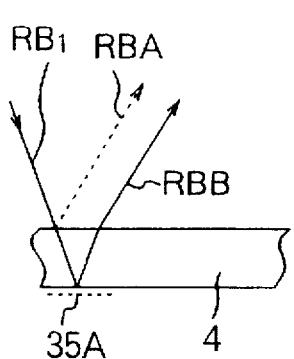
FIGS. 15 to 18 are explanatory views showing how reflected light from a reticle and the like mingles with a luminous flux to be detected.

Then, when the interference light formed by these zero-order and ±1-order light components is to be detected, the regularly reflected light from the surface of the mask 4 may mingle with the zero-order light component $RB_1^0$ or $RB_2^0$. For example, as shown in FIG. 15, since there is an optical path difference between a zero-order light (regularly reflected light) component RBB from the grating mark 35A of the mask 4 and a regularly reflected light component RBA from the surface of the mask 4, when the regularly reflected light component from the surface of the mask 4 mingles with the interference light to be detected, the interference condition may vary so as to greatly change the intensity of the interference light. The interference condition may change due to fluctuation in wavelength of a light source and the change in optical path at the grating mark resulting from the change in temperature.

Figure 12:
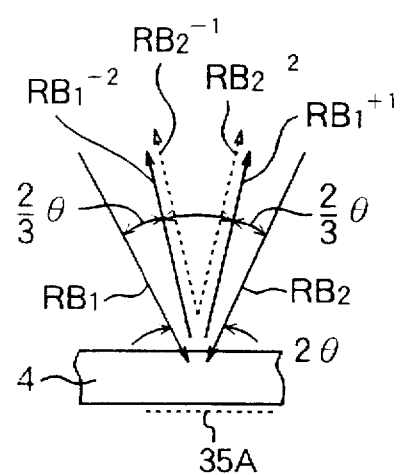
FIG. 12 is an enlarged view showing the periphery of the reticle mark 35A shown in FIG. 2.

In order to eliminate these problems, in the first exposure apparatus in the present invention, diffracted light components having orders different from the order of the regularly reflected light component from the surface of the mask 4 as well as the order of the diffracted light component emitted in a substantially perpendicular direction are interfered with each other. Namely, as shown in FIG. 12, when a +2-order diffracted light component $RB_1^{+2}$ generated by the grating mark 35A upon irradiation with one light beam $RB_1$, for example, and a -1-order diffracted light component $RB_2^{-1}$ generated thereby upon irradiation with the other light beam $RB_2$, for example, are emitted in substantially the same direction and their resulting interference light is detected, the zero-order light is prevented from mingling therewith. When generalized, assuming that the angle of two luminous fluxes with each other is 2θ, it corresponds to a condition where there are an odd number of diffracted light components with the same space therebetween within this angle 2θ. To attain this condition, the pitch P of the grating mark 35A is defined by using an integer n which is not smaller than 2 as follows:

$$P=\{\lambda/(2 \sin \theta)\}(2n-1) \qquad (2)$$

In this case, the sum of the absolute values of the orders of a pair of diffracted light components emitted in parallel without including the zero-order light is (2n-1).

Next, in the second exposure apparatus in the present invention, as shown in FIGS. 19 and 20, for example, ±1-order light components $RB_1^{+1}$ and $RB_2^{-1}$ emitted in a substantially perpendicular direction from the grating mark 35A of the mask 4 are detected as well. In this case, in order to securely prevent the detection light from mingling with the ±1-order diffracted light components from the photosensitive substrate 6, incident angle $\Phi_{RI}$ of the two luminous flux with respect to the mask 4 is made different from incident angle $\Phi_{WI}$ of the two luminous flux with respect to the photosensitive substrate 6 converted to the side of the mask 4. Accordingly, near a Fourier transform surface with respect to the mask 4, for example, two interference light components can be separated from each other nearly completely in a simple manner.

Figure 21:
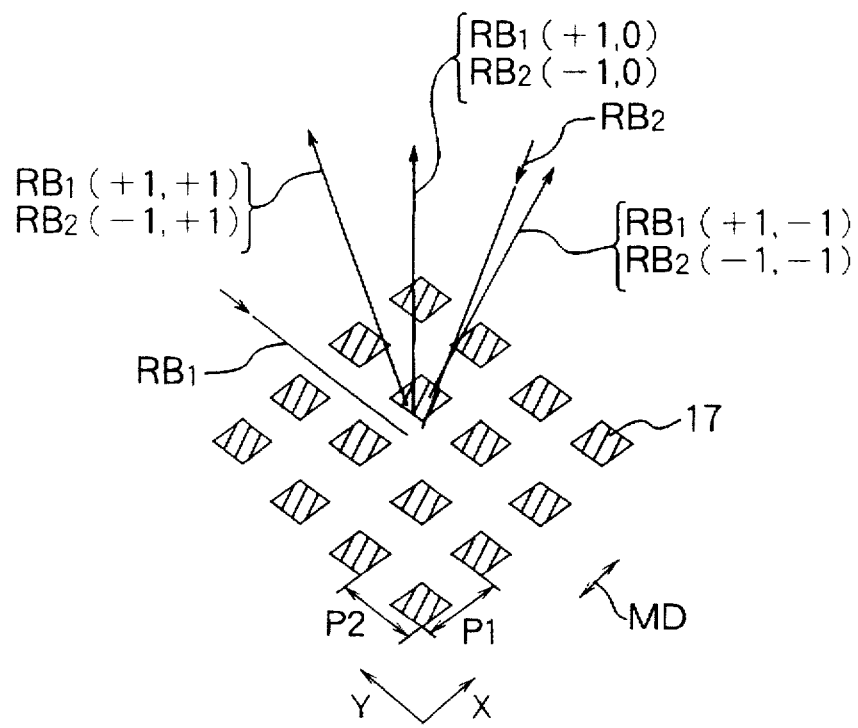
FIG. 21 is an enlarged perspective view of a two-dimensional grating-like mark used in still another embodiment of the present invention.

Also, in the third exposure apparatus of the present invention, as shown in FIG. 21, a two-dimensional grating mark 17 is used as a grating mark on the mask side and, from this two-dimensional grating mark 17, a pair of diffracted light components having an order other than zero-order with respect to a non-measurement direction are detected. Accordingly, as in the case where the incident angles are made different from each other, two interference light components can be favorably separated from each other.

In the following, an embodiment of the present invention will be explained with reference to attached drawings. This embodiment relates to a case where the present invention is applied to a projection exposure apparatus in which a pattern on a reticle is projected upon an individual shot area on a wafer by way of a projection optical system. The alignment sensor used here is an LIA system of both TTR type and heterodyne interference type (i.e., two-luminous-flux interference type alignment sensor). The present invention is also applicable to a homodyne interference type LIA system.

Figure 1:
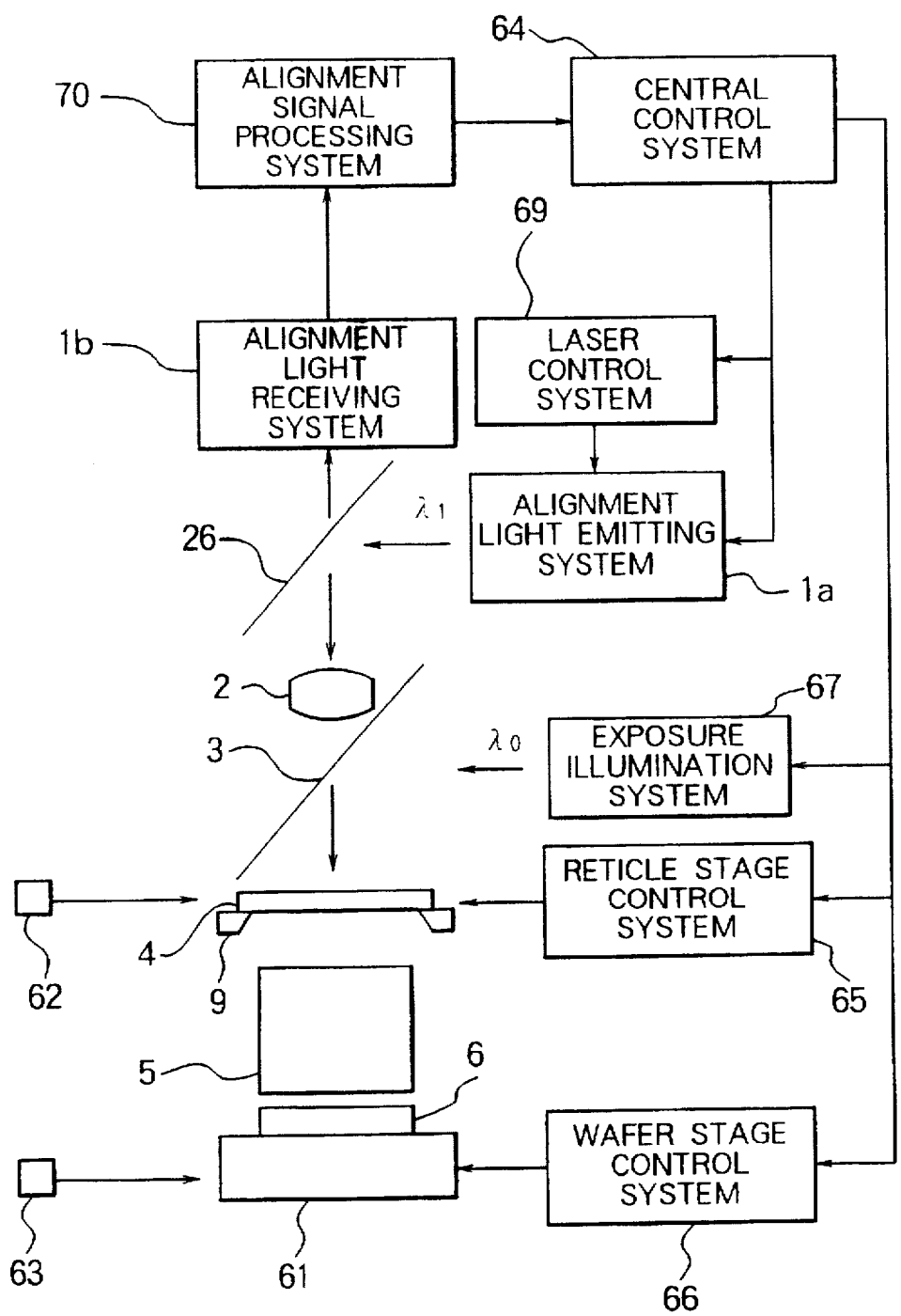
FIG. 1 is a schematic view showing an overall configuration of a projection exposure apparatus in accordance with an embodiment of the present invention.

FIG. 1 shows a schematic overall configuration of the projection exposure apparatus in this embodiment. In this drawing, a reticle 4 is held on a reticle stage 4, whereas a wafer 6 is held on a wafer stage 61. At the time of exposure, illumination light having a wavelength of $\lambda_0$ for exposure from an exposure illumination system 67 impinges on the reticle 4 by way of a dichroic mirror 3. Under this illumination light, a pattern image of the reticle 4 is projected, by way of a projection optical system 5, upon an individual shot area of the wafer 6 coated with a photoresist. The reticle stage 9 and wafer stage 61 respectively position the reticle 4 and the wafer 6 on planes which are perpendicular to an optical axis of the projection optical system 5. Two-dimensional coordinates of the reticle stage 9 and wafer stage 61 are respectively detected by an interferometer 62 on the reticle side and an interferometer 63 on the wafer side and then the results of the detection are supplied to a central control system 64 which controls the actions of the reticle stage 9 and wafer stage 61 respectively by way of a reticle stage control system 65 and a wafer stage control system 66.

Further, in order to position the reticle 4 and the wafer 6 with respect to each other, an LIA system of both TTR type and heterodyne interference type is provided. This LIA system comprises a laser control system 69, an alignment light emitting system 1a, a beam splitter 26, an objective lens 2, an alignment light receiving system 1b, an alignment signal processing system 70, and so on. In order to effect alignment, by way of the laser control system 69, the central control system 64 causes a laser source in the alignment light emitting system 1a to emit light. The laser beam emitted from the laser source in the alignment light emitting system 1a is subjected to a predetermined frequency modulation operation and then directed to the beam splitter 26 as alignment light. The laser beam reflected by the beam splitter 26 passes through the objective lens 2 and the dichroic mirror 3 so as to impinge on a grating-like reticle mark on the reticle 4. The laser beam passing through the reticle 4 impinges on a grating-like wafer mark on the wafer 6.

Interference light (i.e., heterodyne beam) formed by diffracted light components having different frequencies generated upon diffraction at the wafer mark and a heterodyne beam generated upon diffraction at the reticle mark enter the alignment light receiving system 1b by way of the dichroic mirror 3, the objective lens 2, and the beam splitter 26, thereby producing two beat signals at the alignment light receiving system 1b. These beat signals are supplied to the alignment signal processing system 70, where a phase difference between the two beat signals is detected and then thus detected phase difference is supplied to the central control system 64. The central control system 64 effects alignment such that the detected phase difference becomes a predetermined value.

In the following, the heterodyne interference type LIA system will be explained in detail.

FIGS. 2 and 3 show the stage system and alignment system of the projection exposure apparatus in this embodiment. In these drawings, Z-axis is taken in parallel to an optical axis AX of the projection optical system 5, while rectangular coordinates of a plane perpendicular to the Z-axis are taken as X-axis and Y-axis. Here, FIG. 2 is a front view observing the projection exposure apparatus in the Y-direction, whereas FIG. 3 is a side view of FIG. 2. An alignment optical system 1 shown in these drawings corresponds to the alignment light emitting system 1a, beam splitter 26, and alignment light receiving system 1b in FIG. 1; while an X stage 8X and a Y stage 8Y respectively positioning the wafer 6 in X- and Y-directions correspond to the wafer stage 61 in FIG. 1. Also, in FIGS. 2 and 3, a wafer holder 7 is disposed between the wafer stage and the wafer 6 so as to hold the latter. In practice, on the X stage 8X, a Z stage is disposed so as to position the wafer 6 in the Z-direction.

From the alignment optical system 1, reticle alignment illumination light components $RB_1$ and $RB_2$ and wafer alignment light components $WB_1$ and $WB_2$ are emitted with an average wavelength $\lambda_1$, which is different from the exposure wavelength $\lambda_0$, and a frequency difference $\Delta f$ (50 kHz in this embodiment). As depicted by continuous line, the wafer alignment illumination light components $WB_1$ and $WB_2$ intersect with each other at a position upwardly spaced from the pattern surface of the reticle 4 by a distance D. This distance D is defined such that the luminous flux which has passed through the reticle mark of the reticle 4 and then is reflected by the wafer 6 is prevented from mingling with the detection light for the reticle.

As shown in FIG. 2, the reticle alignment illumination light components $RB_1$ and $RB_2$ are converged on the reticle 4 by the objective lens 2 and then impinge on a grating-like reticle mark 35A on the lower surface of the reticle 4 with incident angles $-\theta_{R1}$ and $\theta_{R1}$, respectively.

Figure 7:
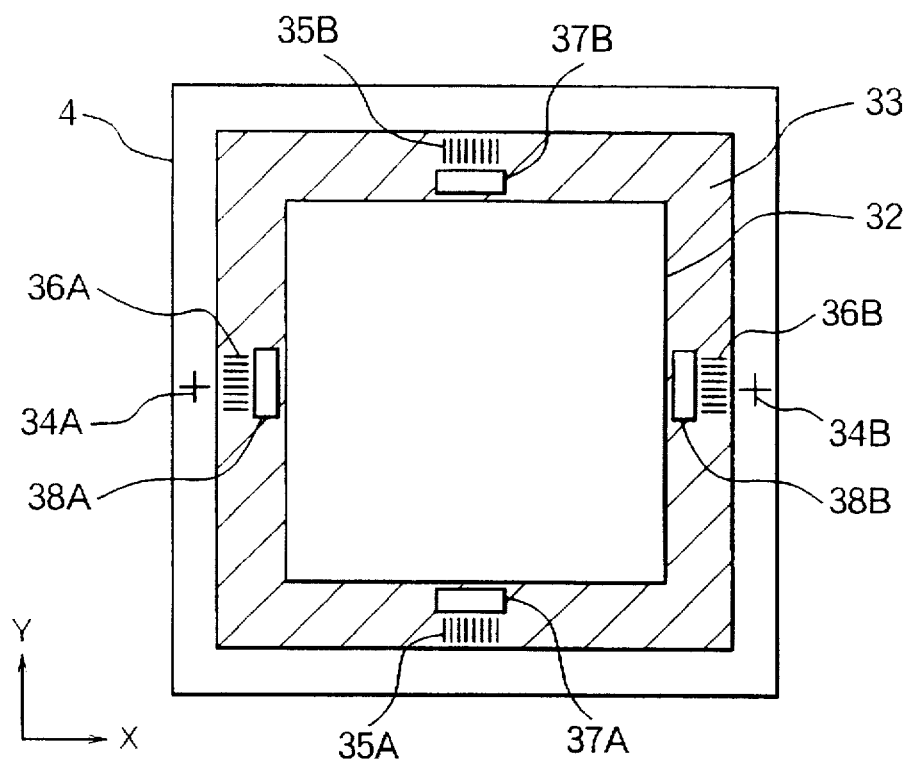
FIG. 7 is a plan view showing a pattern arrangement of the reticle 4 shown in FIGS. 2 and 3.

FIG. 7 shows a pattern arrangement of the reticle 4 in this embodiment. In this drawing, in the periphery of a pattern area 32 at the center portion of the reticle 4, a light-shielding band 33 is formed. In sides extending in the Y-direction in the light-shielding band 33, Y-axis reticle marks 36A and 36B each comprising diffraction gratings formed in the X-direction with a pitch $P_R$ are provided. Also, in sides extending in the X-direction in the light-shielding band 33, X-axis reticle marks 35A and 35B each comprising diffraction gratings formed in the Y-direction with the pitch $P_R$ are provided. Inside the reticle marks 35A and 35B, there are respectively formed permeable window portions 37A and 37B (referred to as "reticle windows" in the following) for transmitting the alignment light directed toward the wafer. Also, inside the reticle marks 36A and 36B, there are respectively formed reticle windows 38A and 38B for transmitting the alignment light directed toward the wafer. Further, cross-like alignment marks 34A and 34B are formed so as to hold the light-shielding band 33 therebetween.

Figure 9:
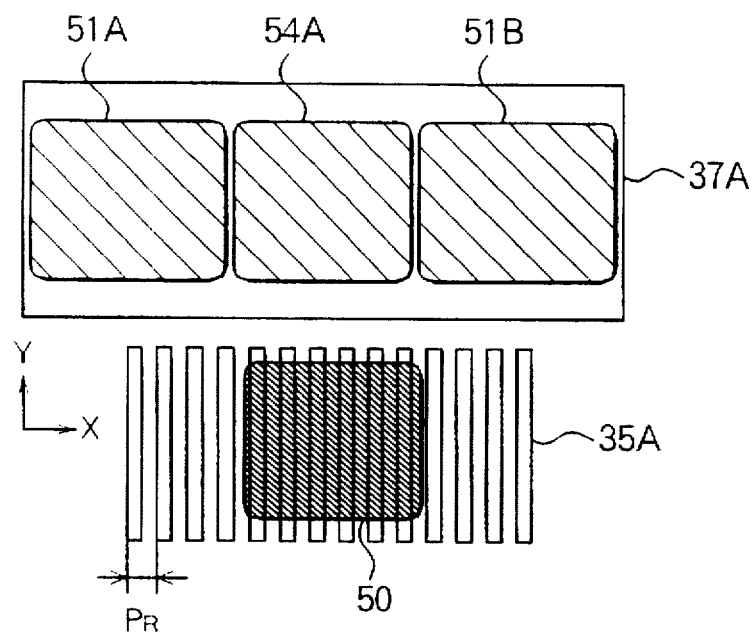
FIG. 9 is an enlarged plan view showing a reticle mark 35A and a reticle window 37A.

FIG. 9 is an enlarged view of the reticle mark 35A and the reticle window 37A shown in FIG. 7. A luminous flux 50 composed of the illumination light components $RB_1$ and $RB_2$ impinges on the reticle mark 35A, whereas a luminous flux 51A composed of the illumination light component $WB_1$ and a luminous flux 51B composed of the illumination light component $WB_2$ pass through the reticle window 37A separately from each other. Also, a luminous flux 54A composed of a pair of diffracted light components from the wafer mark, which will be explained later, passes through the center portion of the reticle window 37A.

Turning back to FIGS. 2 and 3, the incident angles $-\theta_{R1}$ and $\theta_{R1}$ and the grating pitch $P_R$ have the following relationship:

$$P_R = 3\lambda_1 / (2 \sin \theta_{R1}) \quad (3)$$

Thus, the diffraction angle of the first-order diffraction light component is ⅓ of the intersecting angle $2\theta_{R1}$ of the two illumination light components.

Accordingly, a +2-order diffracted light component $RB_1^{+2}$ of the illumination light component $RB_1$ and a −1-order diffracted light component $RB_2^{-1}$ of the illumination light component $RB_2$ are parallelly generated as reticle detection light components (i.e., heterodyne beams) obliquely above the reticle 4, while a +1-order diffracted light component $RB_1^{+1}$ of the illumination light component $RB_1$ and a −2-order diffracted light component $RB_2^{-2}$ of the illumination light component $RB_2$ are parallelly generated as reticle detection light components (i.e., heterodyne beams) obliquely above the reticle 4. These two sets of the reticle detection light components return to the alignment optical system 1 by way of the dichroic mirror 3 and the objective lens 2.

On the other hand, the wafer alignment illumination light components $WB_1$ and $WB_2$ pass through the reticle window 37A on the reticle 4 to reach a chromatic aberration controlling plate 10. At portions of the chromatic aberration controlling plate 10 where the illumination light components $WB_1$ and $WB_2$ pass through, grating-like axial aberration controlling devices $G1_A$ and $G1_B$ (cf. FIG. 11) are respectively formed such that the illumination light components $WB_1$ and $WB_2$ are respectively bent by angles $-\theta_{G1}$ and $\theta_{G1}$ and then impinge on a grating-like wafer mark 48A with incident angles $-\theta_{W1}$ and $\theta_{W1}$.

Figure 8:
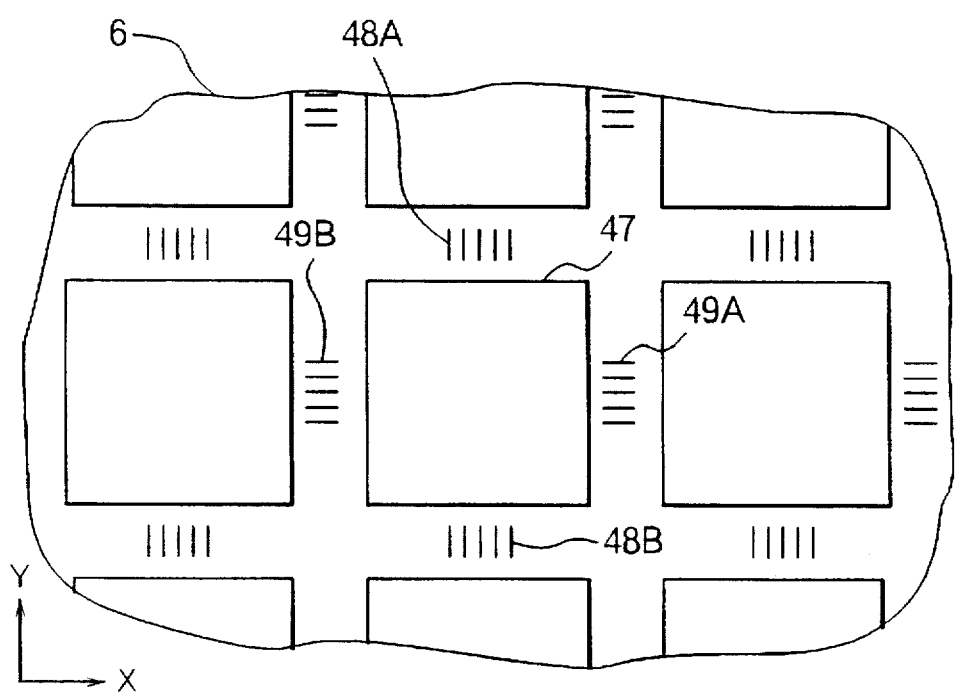
FIG. 8 is an enlarged plan view showing the shot area and wafer mark in the wafer 6 shown in FIGS. 2 and 3.

FIG. 8 shows a part of a shot arrangement in the wafer 6. In this drawing, Y-axis wafer marks 49A and 49B, each comprising diffraction gratings with a pitch $P_W$ in the Y-direction, are formed so as to hold a shot area 47 therebetween in the X-direction. Also, X-axis wafer marks 48A and 48B, each comprising diffraction gratings with the pitch $P_W$ in the X-direction, are formed so as to hold a shot area 47 therebetween in the Y-direction. Similar wafer marks are respectively formed at other shot areas.

Figure 10:
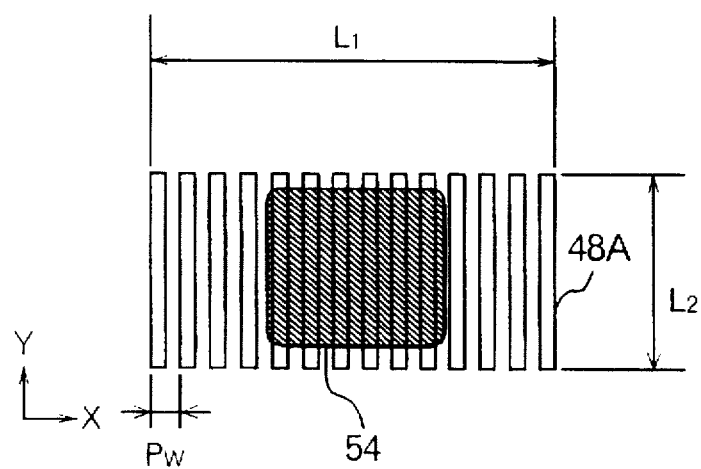
FIG. 10 is an enlarged plan view showing a wafer mark 48A.

FIG. 10 is an enlarged view of the wafer mark 48A shown in FIG. 8. In this drawing, a luminous flux 54 composed of illumination light components $WB_1$ and $WB_2$ impinges on the wafer mark 48A.

Turning back to FIG. 2, the incident angles $-\theta_{R1}$ and $\theta_{R1}$ and the grating pitch $P_W$ of the wafer mark 48A have the following relationship:

$$P_W = \lambda_1 / \sin \theta_{W1} \quad (4)$$

Thus, the +1-order diffracted light component $WB_1^{+1}$ of the illumination light component $WB_1$ and the −1-order diffracted light component $WB_2^{-1}$ of the illumination light component $WB_2$ are generated directly above the wafer mark 48A, while the interference light formed by these two diffracted light components becomes wafer detection light (i.e., heterodyne beam).

In this case, as shown in FIG. 3, the wafer alignment illumination light is incident on the wafer 6 with inclination of an angle $\theta_m$ in the non-measurement direction (i.e., Y-direction) due to the polarizing action of the chromatic aberration controlling plate 10, the positions on the chromatic aberration controlling plate 10 where the wafer detection light components pass through are different from the positions where they have passed through when initially incident thereon. In this embodiment, due to the axial chromatic aberration controlling device comprising a phase grating on the chromatic aberration controlling plate 10, the surface of the wafer 6 and a plane upwardly separated from the pattern surface of the reticle 4 by the distance D are conjugate with each other with respect to the alignment illumination light.

Also, the wafer detection light from the wafer mark 48A passes through the axial chromatic aberration controlling device $G1_C$ on the chromatic aberration controlling plate 10 (cf. FIG. 11), where its transverse chromatic aberration is also corrected, and is directed toward the reticle window 37A. Then, each detection light component returns to the alignment optical system 1 by way of the reticle window 37A, the dichroic mirror 3, and the objective lens 2. Also, the wafer alignment illumination light illuminates a portion on the surface of the wafer 6 which is shifted by $\Delta\beta$ in the Y-direction from the position which is illuminated when the chromatic aberration controlling plate 10 is not disposed.

Figure 11:
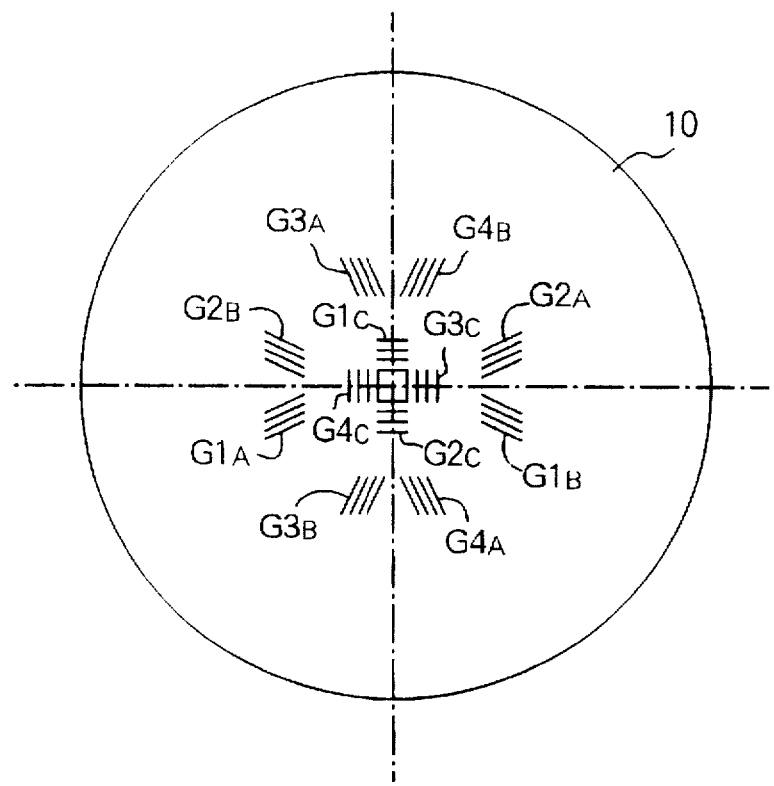
FIG. 11 is a plan view showing an arrangement of an axial chromatic aberration controlling device on the chromatic aberration controlling plate 10 shown in FIGS. 2 and 3.

FIG. 11 shows the chromatic aberration controlling plate 10. In this drawing, on the permeable chromatic aberration controlling plate 10, a dozen pieces of axial chromatic aberration controlling devices are disposed. Among them, three pieces of the axial chromatic aberration controlling devices $G1_A$, $G1_B$, and $G1_C$ are used for polarizing the wafer alignment illumination light and wafer detection light of the alignment optical system 1 shown in FIGS. 2 and 3. In practice, since there are three axial alignment optical systems in addition, 12 (=3×4) pieces of the axial chromatic aberration controlling devices $G1_A$, $G1_B$, $G1_C$ to $G4_A$, $G4_B$, $G_4C$ are formed on the chromatic aberration controlling plate 10 in total.

Here, with reference to FIGS. 4 to 6, the alignment optical system 1 will be explained in detail. Since the alignment optical system 1 is substantially the same as that disclosed in Japanese Unexamined Patent Publication Hei No. 6-310404, its schematic configuration will be explained in the following.

Figure 4:
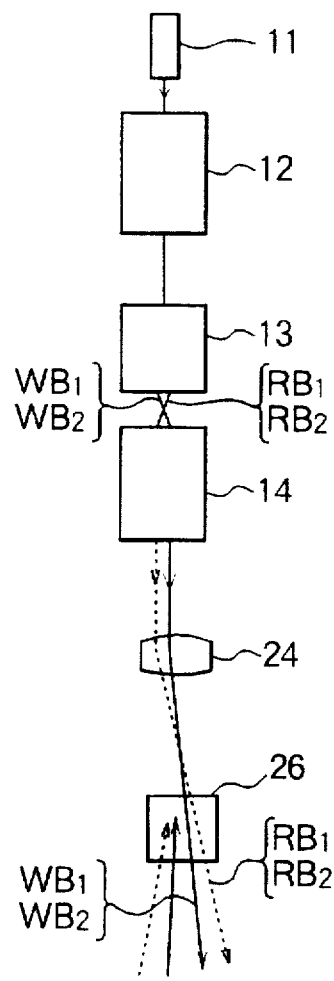
FIG. 4 is a front view showing the alignment optical system 1 shown in FIGS. 2 and 3.
Figure 5:
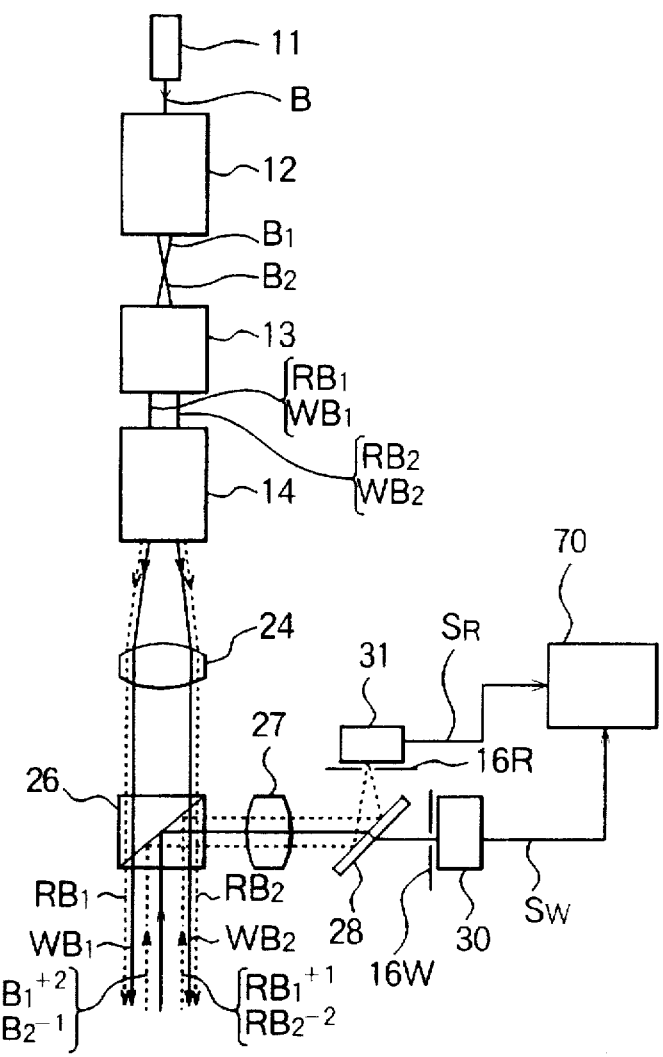
FIG. 5 is a side view of FIG. 4.
Figure 6:
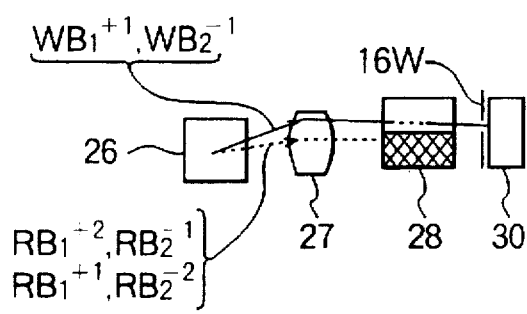
FIG. 6 is a bottom view of FIG. 5.

FIG. 5 is a view of the alignment optical system 1 observed in the same direction as that of FIG. 3, FIG. 4 is a view thereof observed in the same direction as that of FIG. 2, and FIG. 6 is a bottom view of FIG. 5.

In FIGS. 4 to 6, a laser beam having a wavelength of $\lambda_1$ emitted from a laser source 11 comprising a laser diode, for example, enters a modulation optical system 12. The laser beam entering the modulation optical system 12 is turned into alignment beams $B_1$ and $B_2$ which have respectively been subjected to frequency modulation operations of $+(F_1-F_2)$ and $-(F_1-F_2)$, by an acoustooptic device driven with a frequency of $F_1$ and another acoustooptic device driven with a frequency of $F_2$ in the modulation optical system 12, with respect to the laser beam at the time when emitted from the laser source 11. As a result, the frequency difference $\Delta f$ between the alignment beam $B_1$ and the alignment beam $B_2$ is expressed by $2(F_1-F_2)$, which is set to 50 kHz in this embodiment. Also, by a field stop disposed at a position in the modulation optical system 12 which is conjugate with the reticle and the wafer, the cross-sectional forms of the alignment beams $B_1$ and $B_2$ are shaped into a predetermined rectangular form.

A pair of the alignment beams $B_1$ and $B_2$ enter a luminous-flux dividing optical system 13 including, for example, a beam splitter, where one alignment beam $B_1$ is divided into a reticle alignment illumination light component $RB_1$ and a wafer alignment illumination light component $WB_1$, while the other alignment beam $B_2$ is divided into a reticle alignment illumination light component $RB_2$ and a wafer alignment illumination light component $WB_2$. These four illumination light components enter a bifocal optical system 14.

In the bifocal optical system 14, the optical path lengths of a pair of the wafer alignment illumination light components $WB_1$ and $WB_2$ is made longer than that of a pair of the reticle alignment illumination light components $RB_1$ and $RB_2$, thereby shifting the focal position of the reticle alignment illumination light components $RB_1$ and $RB_2$ and that of the wafer alignment illumination light components $WB_1$ and $WB_2$ from each other in the optical axis direction.

Thereafter, the four beams of the alignment illumination light components pass through a lens 24 and the beam splitter 26 so as to be directed to the objective lens 2 shown in FIGS. 2 and 3.

On the other hand, two sets of the reticle detection light components from the reticle mark 35A and a set of the wafer detection light components from the wafer mark 48A shown in FIGS. 2 and 3 return to the alignment optical system 1 shown in FIGS. 4 to 6 and then are reflected by the beam splitter 26 so as to be separated into the reticle detection light and the wafer detection light by a detection light separating beam splitter 28 by way of a lens 27. The reticle detection light components $RB_1^{+2}$ and $RB_2^{-1}$ and the reticle detection light components $RB_1^{+1}$ and $RB_2^{-2}$ are reflected by a reflective portion of the detection light separating beam splitter 28 and then received by a photoelectric detector 31. The wafer detection light components $WB_1^{+1}$ and $WB_2^{-1}$ pass through a permeable portion of the detection light separating beam splitter 28 and then are received by a photoelectric detector 30.

Here, a field stop 16W is disposed at a plane in front of the photoelectric detector 30 which is conjugate with the surface of the wafer 6, while a field stop 16R is disposed at a plane in front of the photoelectric detector 31 which is conjugate with the pattern surface of the reticle 4, such that stray light and the like other than the wafer detection light components $WB_1^{+1}$ and $WB_2^{-1}$ are eliminated by the field stop 16W, while stray light and the like other than the reticle detection light components $RB_1^{+2}$ and $RB_2^{-1}$ and reticle detection light components $RB_1^{+1}$ and $RB_2^{-2}$ are eliminated by the field stop 16R. In particular, since the plane conjugate with the field stop 16W on the wafer side is spaced from the pattern surface of the reticle 4 by the distance D, the reflected light from the reticle 4 caused by the wafer alignment illumination light components $WB_1$ and $WB_2$ is cut off by the field stop 16W.

The photoelectric detector 31 outputs a reticle beat signal $S_R$ which corresponds to the position of the reticle mark, while the photoelectric detector 30 outputs a wafer beat signal $S_W$ which corresponds to the position of the wafer mark.

The reticle beat signal $S_R$ and the wafer beat signal $S_W$ are individually supplied to the alignment signal processing system 70, where the phases of both beat signals are compared with each other and their phase difference is supplied to the central control system 64. From this phase difference, the central control system 64 calculates a target value for relative movement of the reticle stage 9 and the wafer stage 61 with respect to each other in the X-direction and then drives the reticle stage 9 or the wafer stage 61 by this target value. Also, by a non-depicted alignment system for the Y-direction, beat signals corresponding to the Y-axis reticle mark and wafer mark are obtained and their phase difference is supplied to the central control system 64 so as to effect alignment in the Y-direction.

Though the reticle detection light components $RB_1^{+2}$ and $RB_2^{-2}$ and the reticle detection light components $RB_1^{+1}$ and $RB_2^{-2}$ are received by the same photoelectric detector 31 in the embodiment shown in FIGS. 2 and 3, they may be received by respective photoelectric convertors and then the phases of the resulting beat signals may be averaged. Also, one of the two sets of the reticle detection light components (e.g., reticle detection light components $RB_1^{+2}$ and $RB_2^{-1}$) may be detected alone.

In this embodiment, as shown in FIG. 2, the interference light formed by the first diffracted light components $RB_1^{+1}$ and $RB_2^{-1}$ and second diffracted light components $RB_2^{-2}$ and $RB_1^{+2}$, which are neither the zero-order light nor the diffracted light emitted vertically above, is used for detecting the position of the reticle mark 35A. The reason therefor will be explained in the following with reference to FIGS. 12 to 18.

FIG. 12 is an enlarged view showing the periphery of the reticle mark 35A. In this drawing, the angle $\theta_{RI}$ shown in FIG. 2 is expressed by angle $\theta$. Since expression (3) is satisfied, a reticle detection light component comprising the +2-order diffracted light component $RB_1^{+2}$ of the illumination light $RB_1$ and the −1-order diffracted light component $RB_2^{-1}$ of the illumination light $RB_2$ and a reticle detection light component comprising the +1-order diffracted light component $RB_1^{+1}$ of the illumination light $RB_1$ and the −2-order diffracted light component $RB_2^{-2}$ of the illumination light $RB_2$ are generated obliquely above the reticle 4. These two reticle detection light components do not include the regularly reflected light from the reticle 4.

By contrast, as shown in FIG. 13, when the pitch of the reticle mark 35A and the intersecting angle $2\theta$ of the two illumination light components are adjusted such that a reticle detection light component comprising the +1-order diffracted light component $RB_1^{1}$ of the illumination light $RB_1$ and the zero-order light component $RB_2^{0}$ of the illumination light $RB_2$ or a reticle detection light component comprising the zero-order light component $RB_1^{0}$ of the illumination light $RB_1$ and the −1-order diffracted light component $RB_2^{-1}$ of the illumination light $RB_2$ is detected, the reticle detection light may include the regularly reflected light from the surface of the reticle 4.

Namely, as shown in FIG. 15, the regularly reflected light component RBA from the surface of the reticle 4 may mingle with the zero-order light component RBB from the reticle mark 35A on the pattern surface (i.e., rear surface) of the reticle 4. In this case, when the illumination light is monochromatic and coherent like a laser beam, the zero-order light component RBB from the reticle mark 35A and the regularly reflected light component RBA from the reticle surface may interfere with each other. Here, when the light source is a semiconductor laser device or the like whose oscillating wavelength is likely to fluctuate due to back talk or the like, the phase difference between the zero-order light component RBB and the regularly reflected light component RBA may vary, thereby changing the intensity of the resulting signal. For example, when the amplitude reflectance of the reticle mark 35A is 0.64, the amplitude diffraction efficiency of the zero-order light component RBB is about 0.5×0.64, that of the first order light component is 0.32× 0.64, and the amplitude reflectance of the regularly reflected light component RBA from the surface of the reticle 4 is 0.2. Accordingly, the peak intensity of each of the reticle detection light components $RB_1^{+1}$ and $RB_2^{0}$ and reticle detection light components $RB_1^{0}$ and $RB_2^{-1}$ changes ±67% within the range of $(0.32+0.2-0.2)^2 (=0.1)$ to $(0.32+0.2+0.2)^2 (=0.52)$.

Since the glass substrate of the reticle 4 has a thickness of 3 to 6 mm, a wavelength fluctuation as small as 0.01 nm may change the phase difference by 180°. Accordingly, it is necessary for the semiconductor laser device to have a severe wavelength stability. Also, when the temperature of the reticle 4 increases due to irradiation with the exposure light or the like and thereby its refractive index changes, the optical path length may change. Therefore, when the position of the reticle mark 35A is to be detected with a high accuracy, it is not preferable to use the zero-order light component from the reticle mark 35A since the S/N ratio of the resulting beat signal may deteriorate.

By contrast, in this embodiment, though the diffracted light components other than the zero-order light component are to be detected, reflected light may mingle therewith. In the following, the influence thereof will be studied quantitatively.

Figure 16:
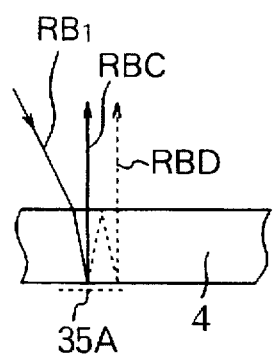

For example, as shown in FIG. 16, a first-order diffracted light component RBC from the reticle mark 35A caused by the illumination light $RB_1$ directed to the reticle 4 is studied. Here, assuming that the regularly reflected light component of the illumination light $RB_1$ from the reticle mark 35A is regularly reflected by the surface of the reticle 4 and then further diffracted by the reticle mark 35A so as to proceed as a reflected light component RBD in the same direction as that of the diffracted light component RBC, the amplitude reflectance with respect to the reflected light component RBD is 0.32×0.2×0.2 (=0.013), while the amplitude reflectance with respect to the diffracted light component RBC is 0.2. Accordingly, the peak intensity of the detected beat signal changes ±13% within the range of 4×(0.2−0.13)²(= 0.14) to (0.2+0.013)²(=0.18).

Figure 17:
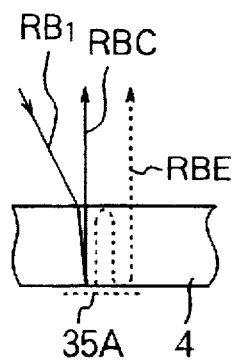

Similarly, as shown in FIG. 17, when it is assumed that the light diffracted by the reticle mark 35A and then regularly reflected by each of the front and rear surfaces of the reticle 4 proceeds as a reflected light component RBE in the same direction as that of the diffracted light component RBC, the peak intensity of the detected beat signal changes ±13%. Accordingly, even at the worst value in which both the reflected light components RBD and RBE are combined together, the peak intensity of the beat signal may change only about ±26%, which is about ⅓ of ±67% in the case where the zero-order diffracted light component is used. Therefore, when the diffracted light components other than the zero-order light component are used as in the case of this embodiment, the ratio of the noise with respect to the resulting reticle beat signal is reduced to about ⅓ of the value where the zero-order light component is used. Though multiple reflection is not considered in the foregoing study, it does not yield any problem since its influence is small.

Also, as shown in FIG. 9, since it is necessary for the second-order diffracted light components $RB_1^{+2}$ and $RB_1^{-2}$ to be detected in this embodiment, the reticle mark 35A preferably has a duty cycle of about 30% (i.e., 30% of a light-shielding portion and 70% of a light-permeable portion) in order to increase the intensity of these second-order diffracted light components.

In this embodiment, the +1-order diffracted light components which are emitted substantially vertically above the wafer mark 48A are to be detected as well.

FIG. 14 is an enlarged view showing the periphery of the wafer mark 48A. In this drawing, from the wafer mark 48A on the wafer 6, the +1-order diffracted light component $WB_2^{+1}$ of the illumination light $WB_1$ and the −1-order diffracted light component $WB_2^{-1}$ of the illumination light $WB_2$ are emitted in parallel to each other and substantially vertically thereabove. Also, in this drawing, the angle θ substitutes for the angle $θ_{WI}$ shown in FIG. 2. While a photoresist FR, as a phase object, is coated on the wafer 6, since the ±1-order diffracted light components emitted in the direction different from that of the zero-order light component are used in this embodiment, as in the case of the reticle mark 35A, the influence of the regularly reflected light on the surface of the photoresist FR is reduced.

Figure 18:
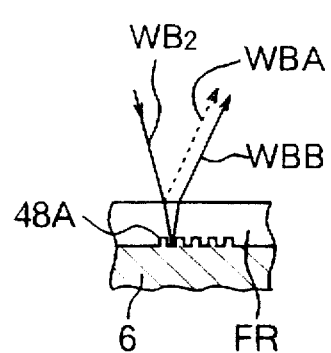

By contrast, when the zero-order light component is used for detecting the position of the reticle mark 35A as shown in FIG. 13, a regularly reflected light component WBA from the surface of the photoresist FR may mingle with the zero-order light component WBB from the wafer mark 48A as shown in FIG. 18. Accordingly, with the arrangement of FIG. 14, the position of the wafer mark 48A should be detected with a high accuracy.

Nevertheless, since the thickness of the photoresist FR is very thin (e.g., about 1 μm) as compared with the reticle 4, it can be assumed that the optical path difference between the zero-order light component WBB and the regularly reflected light component WBA from the surface of the photoresist FR hardly changes when there occurs wavelength fluctuation of the laser source or the like. Accordingly, when the position of the wafer mark 48A is to be detected, the unfavorable influence resulting from the use of the zero-order light component is remarkably smaller than that in the case where the reticle mark 35A is to be detected. Thus, in general, the zero-order light component may be detected as shown in FIG. 13 without any problem.

Also, in the foregoing embodiment, the diffracted light components shown in FIG. 12 are used for detecting the position of the reticle mark 35A in order to prevent the ±1-order diffracted light components, which are used for detecting the position of the wafer mark 48A as shown in FIG. 14, from mingling therewith. By contrast, when the diffracted light components shown in FIG. 12 are used for detecting the position of the wafer mark 48A, the ±1-order diffracted light components shown in FIG. 14 may be used for detecting the position of the reticle mark 35A. Namely, the direction of the diffracted light for detecting the reticle mark 35A and that of the diffracted light for detecting the wafer mark 48A are preferably different from each other.

In the following, another embodiment of the present invention will be explained with reference to FIGS. 19 and 20. In this embodiment, ±1-order diffracted light components which are emitted in substantially vertical directions are respectively used for detecting the positions of the reticle mark and wafer mark, while the incident angles of two luminous fluxes impinging on the reticle mark and wafer mark in a non-measurement direction are made different from each other.

In FIGS. 19 and 20, the portions corresponding to those of FIGS. 2 and 3 are indicated by the marks identical to those of the latter. As shown in FIG. 19, a reticle mark 35A on the pattern surface (i.e., lower surface) of a reticle 4 is irradiated with reticle alignment illumination light components $RB_1$ and $RB_2$ having an intersecting angle $2θ_{RI}$ which are supplied from an alignment optical system 1A. On the other hand, a wafer mark 48A on a wafer 6 is irradiated with wafer alignment illumination light components $WB_1$ and $WB_2$ having an intersecting angle $2θ_{WI}$ which are supplied from the alignment optical system 1A by way of the reticle 4 and a projection optical system 5. The measurement direction of the reticle mark 35A and wafer mark 48A is in the X-direction. The pitch of the reticle mark 35A and the wavelength $λ_1$ of the illumination light are defined such that a +1-order diffracted light component $RB_1^{+1}$ of the illumination light component $RB_1$ and a −1-order diffracted light component $RB_2^{-1}$ of the illumination light component $RB_2$ are emitted vertically from the reticle mark 35A as reticle detection light.

Also, on the side of the wafer mark 48A, ±1-order diffracted light components $WB_1^{+1}$ and $WB_2^{-1}$ emitted substantially vertically above the wafer mark 48A therefrom are used as wafer detection light. In this case, however, the reticle detection light components $RB_1^{+1}$ and $RB_2^{-1}$ and the wafer detection light components $WB_1^{+1}$ and $WB_2^{-1}$ may be emitted in the same direction and mingle with each other as noise light.

In order to eliminate this problem, in this embodiment, as shown in FIG. 20, incident angle $\Phi_{Rl}$ the illumination light components $RB_1^{-1}$ and $RB_2^{-1}$ with respect to the reticle mark 35A and incident angle $\Phi_{Wl}$ of the illumination light components $WB_1^{+1}$ and $WB_2^{-1}$ with respect to the wafer mark 48A are made different from each other. Accordingly, the reticle detection light components $RB_1^{+1}$ and $RB_2^{-1}$ and the wafer detection light components $WB_1^{+1}$ and $WB_2^{-1}$ are directed toward the alignment optical system by way of an objective lens 2, while not in parallel with each other, so that they can be easily separated from each other and detected at the alignment optical system 1A. Specifically, since their passing positions are separated from each other near the Fourier transform surface with respect to the reticle 4, they can be correctly separated from each other there.

In the following, still another embodiment of the present invention will be explained with reference to FIGS. 21 and 22. In this embodiment, a projection exposure apparatus which is substantially the same as that of the embodiment shown in FIGS. 19 and 20 is used. However, in this embodiment, the incident angle of the illumination light with respect to a reticle mark and that with respect to a wafer mark 48A are set equal (e.g., perpendicular) to each other in a non-measurement direction. Also, a two-dimensional grating-like mark 17 such as that shown in FIG. 21 is used in place of the reticle mark 35A.

In FIG. 21, the grating-like mark 17 is a mark in which a rectangular light-shielding pattern is formed with a pitch P1 in the X-direction which is a measurement direction MD and with a pitch P2 in the Y-direction which is a non-measurement direction. The grating-like mark 17 is irradiated with illumination light components $RB_2$ and $RB_2$ having a predetermined intersecting angle along the X-direction. Here, the pitch P1 is defined such that the +1-order diffracted light components are emitted in a direction substantially perpendicular to the grating-like mark 17 in the X-direction. Accordingly, from the grating-like mark 17, a diffracted light component $RB_1(+1,0)$ which is +1-order in the X-direction and zero-order in the Y-direction resulting from the illumination light $RB_1$ and a diffracted light component $RB_2(-1,0)$ which is −1-order in the X-direction and zero-order in the Y-direction resulting from the illumination light $RB_2$ are emitted substantially vertically thereabove.

Also, from the grating-like mark 17, a diffracted light component $RB_1(+1,+1)$ which is +1-order in the X-direction and +1-order in the Y-direction resulting from the illumination light $RB_1$ and a diffracted light component $RB_2(-1,+1)$ which is −1-order in the X-direction and +1-order in the Y-direction resulting from the illumination light $RB_2$ are emitted obliquely in parallel to each other. Similarly, a diffracted light component $RB_1(+1,-1)$ of the illumination light $RB_1$ and a diffracted light component $RB_2(-1,-1)$ of the illumination light $RB_2$ are emitted obliquely in parallel to each other. Angle of diffraction α of the diffracted light components $RB_1(+1,+1)$ and $RB_2(-1,+1)$ in the Y-direction is an angle substantially defined by:

$$\sin \alpha = \lambda_1/P2$$

using the pitch P2 of the grating-like mark in the Y-direction. Accordingly, in this embodiment, the diffracted light components $RB_1(+1,+1)$ and $RB_2(-1,+1)$ parallelly emitted in the Y-direction which is a non-measurement direction are used as the reticle detection light. Since this reticle detection light has a direction different from that of the wafer detection light comprising the ±1-order diffraction light components emitted from the wafer mark 48A shown in FIGS. 19 and 20, they can be substantially completely separated from each other in an easy manner.

Figure 22:
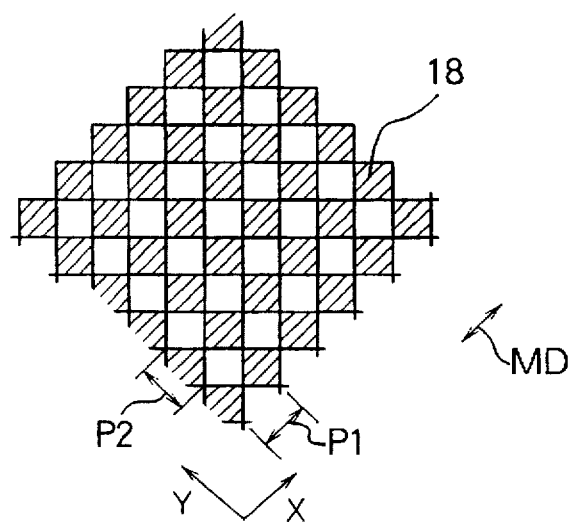
FIG. 22 is a perspective view showing another example of the two-dimensional grating-like mark.

Also, in place of the grating-like mark 17 shown in FIG. 21, a checker 18 such as that shown in FIG. 22 may be used. The checker 18 is advantageous in that the detection light becomes stronger.

To summarize the foregoing embodiments, for example, as shown in FIGS. 2 and 3, in order to prevent the regularly reflected light component from the surface of the reticle 4 from mingling with the detection light with even phases, it is necessary to use a configuration other than that where the zero-order light components $RB_1^0$ and $RB_2^0$ are used as the detection light as shown in FIG. 13. Here, as a first technique for separating the reticle detection light emitted from the reticle mark and the wafer detection light emitted from the wafer mark 48A from each other, one of the reticle side and wafer side is configured such that diffracted light is generated in directions which divide the intersecting angle of two illumination light components into an even number of pieces as shown in FIG. 14, while the other is configured such that diffracted light is generated in directions which divide the intersecting angle of two illumination light components into an odd number of pieces as shown in FIG. 12.

Also, as a second technique, diffracted light components having the same order are used on both the reticle side and wafer side, thereby making the incident angle of the illumination light with respect to the reticle mark different from that with respect to the wafer mark in a non-measurement direction. Further, as a third technique, one of the reticle mark and wafer mark is formed as a two-dimensional mark and the light diffracted in a non-measurement direction is used.

Though a heterodyne interference type LIA system (i.e., two-luminous-flux interference type alignment sensor) is used in the foregoing embodiments, the present invention is also applicable to a case where a homodyne interference type LIA system is used. Further, the present invention can be applied not only to projection exposure apparatuses but also to proximity type exposure apparatuses and contact type exposure apparatuses.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.327919/1994 filed on Dec. 28, 1994 is hereby incorporated by reference.

What is claimed is:

1. An exposure apparatus for transferring a pattern formed on a mask to a photosensitive substrate comprising:

an illumination optical system for supplying exposure light to said mask;

a first irradiation optical system which irradiates a first grating mark formed with a constant pitch $P_1$ on one of said mask and photosensitive substrate with a first light beam from a first direction, while irradiating said first grating mark with a second light beam, which is coherent with said first light beam, from a second direction which is different from said first direction, and said constant pitch $P_1$ is substantially expressed by:

$$P_1 = \{\lambda_1/(2 \sin \theta_1)\}(2n-1)$$

wherein $\lambda_1$ is wavelength of said first and second light beams, $\theta_1$ is a half of angle formed by directions in which said first and second light beams are irradiated, and n is an integer not lower than 2;

a first detector which photoelectrically converts interference light formed by a first diffracted light component, which is other than zero-order and generated from said first grating mark upon irradiation with said first light beam, and a second diffracted light component, which is other than zero-order and generated from said first grating mark upon irradiation with said second light beam, into a signal and, based on thus converted signal, detects a position of said first grating mark, said first and second diffracted light components having diffraction orders different from each other and being generated in the same direction; and a positioning mechanism for positioning said mask and said photosensitive substrate with respect to each other based on the position of said first grating mark detected by said first detector.

2. An exposure apparatus for transferring a pattern formed on a mask to a photosensitive substrate comprising:

an illumination optical system for supplying exposure light to said mask;

a first irradiation optical system which irradiates a first grating mark formed on one of said mask and photosensitive substrate with a first light beam from a first direction, while irradiating said first grating mark with a second light beam, which is coherent with said first light beam, from a second direction which is different from said first direction;

a first detector which photoelectrically converts interference light formed by a first diffracted light component, which is other than zero-order and generated from said first grating mark upon irradiation with said first light beam, and a second diffracted light component, which is other than zero-order and generated from said first grating mark upon irradiation with said second light beam, into a signal and, based on thus converted signal, detects a position of said first grating mark, said first diffracted light component having a first set of two different diffraction orders and being generated in the same direction, said second diffracted light component having a second set of two different diffraction orders and being generated in the same direction;

a second irradiation optical system which irradiates a second grating mark, which is formed on one of said mask and photosensitive substrate on which said first grating mark is not formed, with a third light beam from a third direction, while irradiating said second grating mark with a fourth light beam, which is coherent with said third light beam, from a fourth direction which is different from said third direction, and a focal position of said third and fourth light beams differs from that of said first and second light beams in the optical axis direction;

a second detector which photoelectrically converts interference light formed by a third diffracted light component, which is generated from said second grating mark upon irradiation with said third light beam, and a fourth diffracted light component, which is generated from said second grating mark upon irradiation with said fourth light beam, into a signal and, based on thus converted signal, detects a position of said second grating mark, said third and fourth diffracted light components being generated in a direction substantially perpendicular to a surface where said second grating mark is formed and having absolute values of diffraction orders equal to each other;

a relative deviation detector for detecting an amount of relative positional deviation of said first and second grating marks with respect to each other based on the position of said first grating mark detected by said first detector and the position of said second grating mark detected by said second detector; and a positioning mechanism for positioning said mask and said photosensitive substrate with respect to each other based on signal output from said relative deviation detector.

3. An exposure apparatus for transferring a pattern formed on a mask to a photosensitive substrate comprising:

an illumination optical system for supplying exposure light to said mask;

a first irradiation optical system which irradiates a first grating mark, which is formed with a constant pitch $P_1$ on said mask and arranged in a constant direction, with a first light beam from a first direction, while irradiating said first grating mark with a second light beam, which is coherent with said first light beam, from a second direction which is different from said first direction, and said constant pitch $P_1$ is substantially expressed by:

$$P_1 = \{\lambda_1/(2 \sin \theta_1)\}(2n-1)$$

wherein $\lambda_1$ is wavelength of said first and second light beams, $\theta_1$ is a half of angle formed by directions in which said first and second light beams are irradiated, and n is an integer not lower than 2;

a second irradiation optical system which irradiates a second grating mark, which is formed on said photosensitive substrate with a constant pitch $P_2$ in a direction in which said first grating mark is formed, with a third light beam from a third direction, while irradiating said second grating mark with a fourth light beam, which is coherent with said third light beam, from a fourth direction which is different from said third direction, wherein said constant pitch $P_2$ is substantially expressed by:

$$P_2 = \{\lambda_2/(2 \sin \theta_2)\}(2n-1)$$

wherein $\lambda_2$ is wavelength of said third and fourth light beams, $\theta_2$ is a half of angle formed by directions in which said third and fourth light beams are irradiated, and n is an integer not lower than 2;

a first detector which photoelectrically converts interference light formed by a +1-order diffracted light component, which is generated from said first grating mark upon irradiation with said first light beam, and −1-order diffracted light component, which is generated from said first grating mark upon irradiation with said second light beam, into a signal and, based on thus converted signal, detects a position of said first grating mark;

a second detector which photoelectrically converts interference light formed by a +1-order diffracted light component, which is generated from said second grating mark upon irradiation with said third light beam, and −1-order diffracted light component, which is generated from said second grating mark upon irradiation with said fourth light beam, into a signal and, based on thus converted signal, detects a position of said second grating mark; in a direction perpendicular to the direction in which said first grating mark is arranged, said first and second light beams having identical incident angles with respect to said first grating mark while said third and fourth light beams having identical incident angles with respect to said second grating mark, whereas the incident angle of said first light beam with respect to said first grating mark and the incident angle of said third light beam with respect to said second grating mark being different from each other; and a positioning mechanism for positioning said mask and said photosensitive substrate with respect to each other based on signals output from said first and second detector.

4. An exposure apparatus according to claim 3, wherein said positioning mechanism positions said mask and said photosensitive substrate with respect to each other based on a phase difference between signals output from said first and second detector.

5. An exposure apparatus for transferring a pattern formed on a mask to a photosensitive substrate comprising:

an illumination optical system for supplying exposure light to said mask;

an irradiation optical system for irradiating a grating mark, which is two-dimensionally formed on one of said mask and photosensitive substrate with constant pitches respectively in a measurement direction and a non-measurement direction which is not in parallel to said measurement direction, with a first light beam from a first direction, while irradiating said grating mark with a second light beam, which is coherent with said first light beam, from a second direction which is different from said first direction, thereby measuring a position of said grating mark in said measurement direction, and said constant pitch $P_1$ in said measurement direction is substantially expressed by:

$$P_1 = \{\lambda_1/(2 \sin \theta_1)\}(2n-1)$$

wherein $\lambda_1$ is wavelength of said first and second light beams, $\theta_1$ is a half of angle formed by directions in which said first and second light beams are irradiated, and n is an integer not lower than 2;

a detector which photoelectrically converts interference light formed by a first diffracted light component, which is generated from said grating mark upon irradiation with said first light beam, and a second diffracted light component, which is generated from said grating mark upon irradiation with said second light beam, into a signal and, based on thus converted signal, detects a position of said grating mark in said measurement position, said first and second diffracted light components having diffraction orders other than zero-order with respect to said non-measurement direction and being generated in the same direction; and a positioning mechanism for positioning said mask and said photosensitive substrate with respect to each other in said measurement direction based on the position of said grating mark detected by said detector.

6. An exposure method for transferring a pattern formed on a mask to a photosensitive substrate comprising:

irradiating a first grating mark formed with a constant pitch $P_1$ on one of said mask and photosensitive substrate with a first light beam from a first direction, while irradiating said first grating mark with a second light beam which is coherent with said first light beam, from a second direction which is different from said first direction, wherein said constant pitch $P_1$ in said measurement direction is substantially expressed by:

$$P_1 = \{\lambda_1/(2 \sin \theta_1)\}(2n-1)$$

wherein $\lambda_1$ is wavelength of said first and second light beams, $\theta_1$ is a half of angle formed by directions in which said first and second light beams are irradiated, and n is an integer not lower than 2;

photoelectrically converting interference light formed by a first diffracted light component, which is other than zero-order and generated from said first grating mark upon irradiation with said first light beam, and a second diffracted light component, which is other than zero-order and generated from said first grating mark upon irradiation with said second light beam, into a signal, said first and second diffracted light components having diffraction orders different from each other and being generated in the same direction;

detecting a position of said first grating mark based on thus converted signal;

positioning said mask and said photosensitive substrate with respect to each other based on the detected position of said first grating mark; and supplying exposure light to said mask to transfer a pattern formed on said mask onto said photosensitive substrate.

7. An exposure method for transferring a pattern formed on a mask to a photosensitive substrate comprising:

irradiating a first grating mark, which is formed with a constant pitch $P_1$ on said mask and arranged in a constant direction, with a first light beam from a first direction, while irradiating said first grating mark with a second light beam, which is coherent with said first light beam, from a second direction which is different from said first direction, wherein said constant pitch $P_1$ in said measurement direction is substantially expressed by:

$$P_1 = \{\lambda_1/(2 \sin \theta_1)\}(2n-1)$$

wherein $\lambda_1$ is wavelength of said first and second light beams, $\theta_1$ is a half of angle formed by directions in which said first and second light beams are irradiated, and n is an integer not lower than 2;

irradiating a second grating mark, which is formed on said photosensitive substrate with a constant pitch $P_2$ in a direction in which said first grating mark is formed, with a third light beam from a third direction, while irradiating said second grating mark with a fourth light beam, which is coherent with said third light beam, from a fourth direction, which is different from said third direction, wherein said constant pitch $P_2$ is substantially expressed by:

$$P_2 = \{\lambda_2/(2 \sin \theta_2)\}(2n-1)$$

wherein $\lambda_2$ is wavelength of said third and fourth light beams, $\theta_2$ is a half of angle formed by directions in which said third and fourth light beams are irradiated, and n is an integer not lower than 2;

photoelectrically converting interference light formed by a +1-order diffracted light component, which is generated from said first grating mark upon irradiation with said first light beam, and −1-order diffracted light component, which is generated from said first grating mark upon irradiation with said second light beam, into a signal;

detecting a position of said first grating mark based on thus converted signal;

photoelectrically converting interference light formed by a +1-order diffracted light component, which is generated from said second grating mark upon irradiation with said third light beam, and −1-order diffracted light component, which is generated from said second grating mark upon irradiation with said fourth light beam, into a signal; in a direction perpendicular to the direction in which said first grating mark is arranged, said first and second light beams having identical incident angles with respect to said first grating mark while said third and fourth light beams having identical incident angles with respect to said second grating mark, whereas the incident angle of said first light beam with respect to said first grating mark and the incident angle of said third light beam with respect to said second grating mark being different from each other;

detecting a position of said second grating mark based on thus converted signal;

positioning said mask and said photosensitive substrate with respect to each other based on the position of said first and second grating mark; and supplying exposure light to said mask to transfer a pattern formed on said mask onto said photosensitive substrate.

8. An exposure method for transferring a pattern formed on a mask to a photosensitive substrate comprising:

irradiating a grating mark, which is two-dimensionally formed on one of said mask and photosensitive substrate with constant pitches respectively in a measurement direction and a non-measurement direction which is not in parallel to said measurement direction, with a first light beam from a first direction, while irradiating said grating mark with a second light beam, which is coherent with said first light beam, from a second direction which is different from said first direction, thereby measuring a position of said grating mark in said measurement direction, wherein said constant pitch $P_1$ in said measurement direction is substantially expressed by:

$$P_1 = \{\lambda_1/(2 \sin \theta_1)\}(2n-1)$$

wherein $\lambda_1$ is wavelength of said first and second light beams, $\theta_1$ is a half of angle formed by directions in which said first and second light beams are irradiated, and n is an integer not lower than 2;

photoelectrically converting interference light formed by a first diffracted light component, which is generated from said grating mark upon irradiation with said first light beam, and a second diffracted light component, which is generated from said grating mark upon irradiation with said second light beam, into a signal, said first and second diffracted light components having diffraction orders other than zero-order with respect to said non-measurement direction and being generated in the same direction;

detecting a position of said grating mark in said measurement position based on thus converted signal;

positioning said mask and said photosensitive substrate with respect to each other in said measurement direction based on the detected position of said grating mark; and supplying exposure light to said mask to transfer a pattern formed on said mask onto said photosensitive substrate.

9. An exposure apparatus for transferring a pattern formed on a mask to a photosensitive substrate comprising:

an illumination optical system for supplying exposure light to said mask;

a first irradiation optical system for irradiating a first grating mark, which is two-dimensionally formed on one of said mask and photosensitive substrate with constant pitches respectively in a measurement direction and a non-measurement direction which is not in parallel to said measurement direction, with a first light beam from a first direction, while irradiating said first grating mark with a second light beam, which is coherent with said first light beam, from a second direction which is different from said first direction, thereby measuring a position of said first grating mark in said measurement direction;

a second irradiation optical system for irradiating a second grating mark, which is two-dimensionally formed on one of said mask and photosensitive substrate on which said first grating mask is not formed, with constant pitches respectively in a measurement direction and a non-measurement direction which is not in parallel to said measurement direction, with a third light beam from a third direction, while irradiating said second grating mark with a fourth light beam, which is coherent with said third light beam, from a fourth direction which is different from said third direction, thereby measuring a position of said second grating mark in said measurement direction, wherein a focal position of said third and fourth light beams differs from that of said first and second light beams in the optical axis direction;

a first detector which photoelectrically converts interference light formed by a first diffracted light component, which is generated from said first grating mark upon irradiation with said first light beam, and a second diffracted light component, which is generated from said first grating mark upon irradiation with said second light beam, into a signal and, based on thus converted signal, detects a position of said first grating mark in said measurement position, said first diffracted light component having a first set of two different diffraction orders other than zero-order with respect to said non-measurement direction and being generated in the same direction, said second diffracted light component having a second set of two different diffraction orders other than zero-order with respect to said non-measurement direction and being generated in the same direction;

a second detector which photoelectrically converts interference light formed by a third diffracted light component, which is generated from said second grating mark upon irradiation with said third light beam, and a fourth diffracted light component, which is generated from said second grating mark upon irradiation with said fourth light beam, into a signal and, based on thus converted signal, detects a position of said second grating mark in said measurement position, said third and fourth diffracted light components having diffraction orders other than zero-order with respect to said non-measurement direction and being generated in the same direction;

a positioning mechanism for positioning said mask and said photosensitive substrate with respect to each other in said measurement direction based on the positions of said first and second grating marks detected by said first and second detectors.

10. An exposure method for transferring a pattern formed on a mask to a photosensitive substrate comprising:

irradiating a first grating mark formed on one of said mask and photosensitive substrate with a first light beam from a first direction, while irradiating said first grating mark with a second light beam which is coherent with said first light beam, from a second direction which is different from said first direction;

irradiating a second grating mark formed on one of said mask and photosensitive substrate on which said first grating mark is not formed, with a third light beam from a third direction, while irradiating said second grating mark with a fourth light beam which is coherent with said third light beam, from a fourth direction which is different from said third direction, wherein a focal position of said third and fourth light beams differs from that of said first and second light beams in the optical direction;

photoelectrically converting interference light formed by a first diffracted light component, which is other than zero-order and generated from said first grating mark upon irradiation with said first light beam, and a second diffracted light component, which is other than zero-order and generated from said first grating mark upon irradiation with said second light beam, into a signal, said first diffracted light component having a first set of two different diffraction orders and being generated in the same direction, said second diffracted light component having a second set of two different diffraction orders and being generated in the same direction;

detecting a position of said first grating mark based on thus converted signal;

photoelectrically converting interference light formed by a third diffracted light component, which is other than zero-order and generated from said second grating mark upon irradiation with said third light beam, and a fourth diffracted light component, which is other than zero-order and generated from said second grating mark upon irradiation with said fourth light beam, into a signal, said third and fourth diffracted light components having diffraction orders different from each other and being generated in the same direction;

detecting a position of said second grating mark based on thus converted signal;

positioning said mask and said photosensitive substrate with respect to each other based on the detected positions of said first and second grating marks; and supplying exposure light to said mask to transfer a pattern formed on said mask onto said photosensitive substrate.

11. An exposure method for transferring a pattern formed on a mask to a photosensitive substrate comprising:

irradiating a first grating mark, which is two-dimensionally formed on one of said mask and photosensitive substrate with constant pitches respectively in a measurement direction and a non-measurement direction which is not in parallel to said measurement direction, with a first light beam from a first direction, while irradiating said first grating mark with a second light beam, which is coherent with said first light beam, from a second direction which is different from said first direction, thereby measuring a position of said first grating mark in said measurement direction;

irradiating a second grating mark, which is two-dimensionally formed on one of said mask and photosensitive substrate on which said first grating mark is not formed, with constant pitches respectively in a measurement direction and a non-measurement direction which is not in parallel to said measurement direction, with a third light beam from a third direction, while irradiating said second grating mark with a fourth light beam, which is coherent with said third light beam, from a fourth direction which is different from said third direction, thereby measuring a position of said second grating mark in said measurement direction;

photoelectrically converting interference light formed by a first diffracted light component, which is generated from said first grating mark upon irradiation with said first light beam, and a second diffracted light component, which is generated from said first grating mark upon irradiation with said second light beam, into a signal, said first diffracted light component having a first set of two different diffraction orders other than zero-order with respect to said non-measurement direction and being generated in the same direction, said second diffracted light component having a second set of two different diffraction orders other than zero-order with respect to said non-measurement direction and being generated in the same direction;

detecting a position of said first grating mark in said measurement position based on thus converted signal;

photoelectrically converting interference light formed by a third diffracted light component, which is generated from said second grating mark upon irradiation with said third light beam, and a fourth diffracted light component, which is generated from said second grating mark upon irradiation with said fourth light beam, into a signal, said third and fourth diffracted light components having diffraction orders other than zero-order with respect to said non-measurement direction and being generated in the same direction;

detecting a position of said second grating mark in said measurement position based on thus converted signal;

positioning said mask and said photosensitive substrate with respect to each other in said measurement direction based on the detected positions of said first and second grating marks; and supplying exposure light to said mask to transfer a pattern formed on said mask onto said photosensitive substrate.

\* \* \* \* \*